United States Patent
Yokoyama et al.

(10) Patent No.: US 7,700,067 B2
(45) Date of Patent: Apr. 20, 2010

(54) CRYSTALLOGRAPHICALLY-ORIENTED CERAMIC

(75) Inventors: Shohei Yokoyama, Nagoya (JP);
Nobuyuki Kobayashi, Nagoya (JP);
Tsutomu Nanataki, Toyoake (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 34 days.

(21) Appl. No.: 12/035,491

(22) Filed: Feb. 22, 2008

(65) Prior Publication Data
US 2009/0185971 A1 Jul. 23, 2009

(30) Foreign Application Priority Data
Jan. 21, 2008 (JP) ............................. 2008-010167

(51) Int. Cl.
C01G 53/04 (2006.01)
C01G 33/00 (2006.01)
C01G 35/00 (2006.01)
C01G 21/02 (2006.01)
C01G 25/02 (2006.01)
C01D 1/02 (2006.01)
C01G 23/04 (2006.01)

(52) U.S. Cl. .............. 423/593.1; 423/594.3; 423/594.8; 423/594.9; 423/594.12; 423/594.15; 423/598

(58) Field of Classification Search .............. 423/593.1, 423/594.12, 594.15, 594.3, 594.8, 594.9, 423/598
See application file for complete search history.

(56) References Cited

U.S. PATENT DOCUMENTS
6,760,181 B2 * 7/2004 Li et al. ..................... 360/75

(Continued)

FOREIGN PATENT DOCUMENTS
EP 1 253 121 A2 10/2002

(Continued)

OTHER PUBLICATIONS http://v3.espacenet.com/inpadoc?KC=A2&NR=1253121A2&DB=EPODOC&submitted=true&locale=en_EP&CC=EP&FT=D Visited May 21, 2009 (Espacenet patent family listing for EP 1253121).*

(Continued)

*Primary Examiner*—Timothy C Vanoy
*Assistant Examiner*—Daniel Berns
(74) *Attorney, Agent, or Firm*—Burr & Brown (57) ABSTRACT

A crystallographically-oriented ceramic including first regions, in which crystal nuclei remain and which contain a specific element in a predetermined concentration range and extend at least partially in a layered shape along a crystal plane, and second regions, which contain the specific element in a different concentration range from the first regions and extend at least partially in a layered shape along the crystal plane. The regions are alternately repeated, and a compositional distribution exists in a direction orthogonal to the crystal plane. In the first region, the concentration of Na is higher, the concentration of K is lower, the concentration of Nb is lower, and the concentration of Ta is higher than the second region, and in the second region, the concentration of Na is lower, the concentration of K is higher, the concentration of Nb is higher, and the concentration of Ta is lower than the first region.

9 Claims, 6 Drawing Sheets

U.S. PATENT DOCUMENTS

2003/0012373 A1    1/2003   Ogura et al.
2004/0120881 A1    6/2004   Takao et al.
2006/0209354 A1*   9/2006   Saito et al. ................. 358/406
2008/0248277 A1*  10/2008   Yokoyama et al. .......... 428/220

FOREIGN PATENT DOCUMENTS

| JP | 2003-012373    | 1/2003 |
|----|----------------|--------|
| JP | 2007-173679 A1 | 7/2007 |
| JP | 2008-013395 A1 | 1/2008 |
| WO | 2007/074566 A1 | 7/2007 |

OTHER PUBLICATIONS http://v3.espacenet.com/inpadoc?KC=A1&NR=2007074566A1&DB=EPODOC&submitted=true&locale=en_EP&CC=WO&FT=D Visited May 21, 2009 (Espacenet patent family listing for WO 2007/074566).*

* cited by examiner

FIG. 1

Na、Ta：HIGH、K、Nb：LOW        Na、Ta：LOW、K、Nb：HIGH

CRYSTALLOGRAPHICALLY-ORIENTED CERAMIC

BACKGROUND OF THE INVENTION

1. Field of the Invention

The present invention relates to a crystallographically-oriented ceramic. Specifically, the invention relates to a crystallographically-oriented ceramic used for a piezoelectric/electrostrictive material.

2. Description of the Related Art

In a crystallographically-oriented ceramic which has been proposed to date, a mixture of a first anisotropically shaped powder having lattice matching with a specific crystal plane of a first perovskite-type alkali-pentavalent metal oxide compound and a first reaction material capable of reacting with the first anisotropically shaped powder to form a first perovskite-type alkali-pentavalent metal oxide compound is shaped such that the first anisotropically shaped powder is oriented, and orientation is further enhanced by firing, thereby enhancing piezoelectric properties (for example, refer to Japanese Unexamined Patent Application Publication No. 2003-12373).

In the crystallographically-oriented ceramic described in Japanese Unexamined Patent Application Publication No. 2003-12373, piezoelectric properties are enhanced by enhancing orientation. It is assumed that, in order to enhance the piezoelectric properties, the crystallographically-oriented ceramic formed from the first anisotropically shaped powder and the first reaction material is produced so as to have a more uniform composition. As described above, in the crystallographically-oriented ceramic described in Japanese Unexamined Patent Application Publication No. 2003-12373, in order to enhance the piezoelectric/electrostrictive properties, crystals are oriented, and furthermore the compositional ratio is appropriately set in a more uniform state. However, this is still not sufficient. Further enhancements in piezoelectric/electrostrictive properties are desired.

SUMMARY OF THE INVENTION

The present invention has been achieved in consideration of the problems described above. An object of the invention is to provide a crystallographically-oriented ceramic in which piezoelectric/electrostrictive properties can be further enhanced.

In order to achieve the above-mentioned object, the present invention has the following structure.

As a result of diligent studies conducted by the present inventors to achieve the object described above, it has been found that, when an element compositional distribution exists in a crystallographically-oriented ceramic, piezoelectric/electrostrictive properties can be further enhanced, and thereby the present invention has been completed.

That is, a crystallographically-oriented ceramic according to the present invention includes crystals oriented along a predetermined crystal plane, wherein an element compositional distribution exists in a direction orthogonal to the crystal plane, and the crystallographically-oriented ceramic has a degree of orientation of 25% or more when measured by the Lotgering method.

In the crystallographically-oriented ceramic, since crystals are oriented along a predetermined crystal plane, piezoelectric/electrostrictive properties can be enhanced, and since the element compositional distribution exists in a direction orthogonal to the crystal plane, piezoelectric/electrostrictive properties can be further enhanced. Although the reason for this is not clear, if the compositional distribution exists in the direction orthogonal to the crystal plane, a distribution also occurs with respect to the crystal system and the lattice constant. As a result, stress (lattice strain) is introduced into grains, and the crystal structure becomes unstable, namely, asymmetry increases. Therefore, it is assumed that piezoelectric/electrostrictive properties are improved.

DETAILED DESCRIPTION OF THE INVENTION

In a crystallographically-oriented ceramic according to the present invention, crystals are oriented along a predetermined crystal plane, and an element compositional distribution exists. The existence of the compositional distribution can be confirmed, for example, by the fact that the X-ray diffraction profile shows a broader distribution of lattice constants, and by performing SEM observation and measurement of element distribution. In the crystallographically-oriented ceramic, the degree of orientation of the crystal plane measured by the Lotgering method is preferably 25% or more, more preferably 30% or more, and still more preferably 60% or more. At a degree of orientation of 25% or more, the crystallographically-oriented ceramic can be used satisfactorily. The predetermined crystal plane may be the pseudocubic (100) plane. The term "pseudocubic (100)" means that although an isotropic perovskite-type oxide has a structure, such as a tetragonal, rhombic, or trigonal structure, which is slightly distorted from the cubic structure, since the amount of distortion is very small, the pseudocubic structure is considered to be a cubic structure and designated by the Miller indices. Here, in the measurement of the degree of orientation by the Lotgering method, XRD diffraction patterns of oriented planes of the crystallographically-oriented ceramic are measured and the degree of orientation is obtained using formula (1) below. In formula (1), $\Sigma I(hkl)$ is the sum of X-ray diffraction intensities of all crystal planes (hkl) measured in the crystallographically-oriented ceramic; $\Sigma I_0(hkl)$ is the sum of X-ray diffraction intensities of all crystal planes (hkl) measured in a non-oriented ceramic having the same composition as the crystallographically-oriented ceramic; $\Sigma'I(HKL)$ is the sum of X-ray diffraction intensities of crystallographically equivalent specific crystal planes (e.g., (100) plane) measured in the crystallographically-oriented ceramic; and $\Sigma'I_0(HKL)$ is the sum of X-ray diffraction intensities of specific crystal planes measured in a non-oriented ceramic having the same composition as the crystallographically-oriented ceramic.

$$\text{DEGREE OF ORIENTATION} = \frac{\frac{\Sigma' I(HKL)}{\Sigma I(hkl)} - \frac{\Sigma' I_0(HKL)}{\Sigma I_0(hkl)}}{1 - \frac{\Sigma' I_0(HKL)}{\Sigma I_0(hkl)}} \times 100\% \quad \text{Formula (1)}$$

Figure 1:
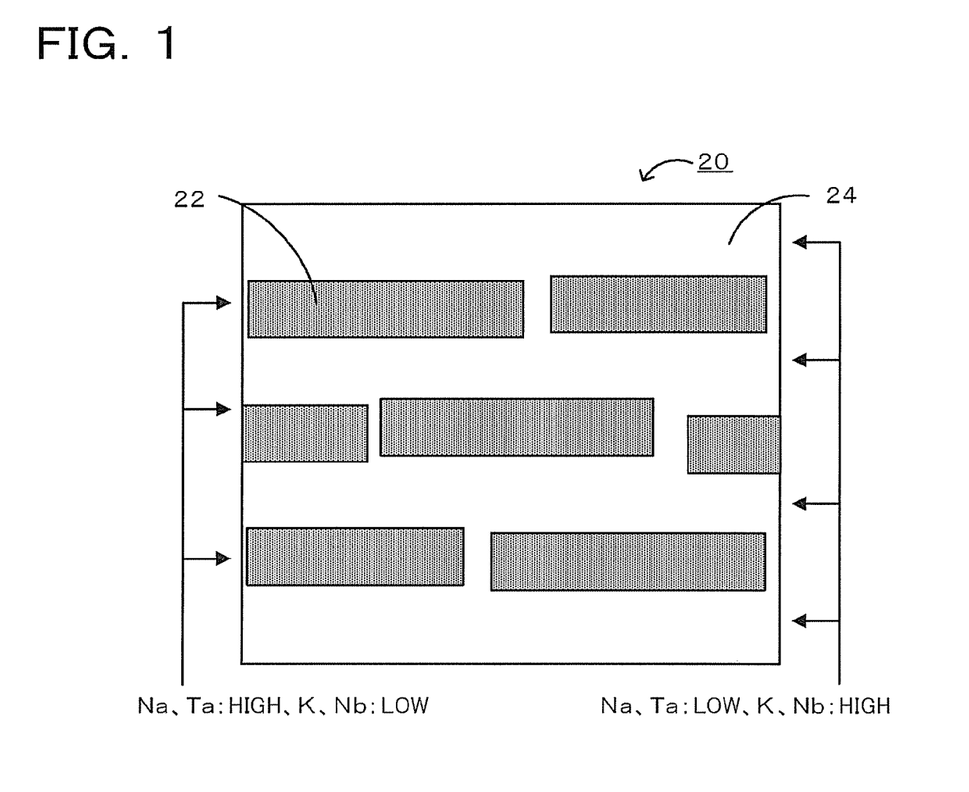
FIG. 1 is a schematic diagram of a crystallographically-oriented ceramic 20 having a compositional distribution.

In the crystallographically-oriented ceramic according to the present invention, a compositional distribution exists in a direction orthogonal to the crystal plane. In such a case, lattice strain is generated in a direction parallel to the crystal plane. Therefore, it is assumed that, when an electric field is applied in a direction orthogonal to the crystal plane, piezoelectric/electrostrictive properties can be further enhanced. The compositional distribution may exist at least partially in a layered shape along the crystal plane. In such a case, by performing crystal growth along the crystal plane of crystal nuclei, such as an anisotropically shaped (layered) template member having a different composition, it is possible to relatively easily form a crystallographically-oriented ceramic having a compositional distribution in a direction orthogonal to the crystal plane. Here, the term "at least partially in a layered shape" may mean that the compositional distribution is entirely in the shape of a layer or may include the case where, when the interior of the crystallographically-oriented ceramic is viewed microscopically, a part thereof is observed to be in a layered shape. FIG. 1 is a schematic diagram showing a crystallographically-oriented ceramic 20 having a compositional distribution. The crystallographically-oriented ceramic 20, which will be described in detail later, includes first regions 22 extending along the crystal plane in a layered shape and second regions 24. The thickness of the "layer" is preferably 0.1 to 15 µm, more preferably 1 to 10 µm, and still more preferably 2 to 5 µm. At a thickness of 0.1 µm or more, sufficient stress (lattice strain) can be introduced into grains, and at a thickness of 15 µm or less, the width of the compositional distribution can be further decreased, and piezoelectric/electrostrictive properties can be further enhanced. The compositional distribution may have regions having different compositions within a crystal grain. In such a structure, a distribution also occurs with respect to the crystal system and the lattice constant. As a result, stress (lattice strain) is assumed to be introduced into grains, which is preferable.

The crystallographically-oriented ceramic of the present invention preferably has a compositional distribution in which first regions containing a specific element in a predetermined concentration range and second regions containing the specific element in a different concentration range from the first regions are alternately repeated. In such a case, since a compositional distribution occurs between the first region and the second region, piezoelectric/electrostrictive properties are more easily enhanced. The boundary between the first region and the second region may be definitely delimited or may have a width. The expression "the boundary has a width" means that the first region and the second region are not definitely delimited, for example, in a case where a region having a concentration range recognized as the first region and a region having a concentration range recognized as the second region are located without being close to each other. Furthermore, the boundary between the first region and the second region may be present within a crystal grain contained in the crystallographically-oriented ceramic. Furthermore, each of the first region and the second region may have a layered shape. Here, the existence of the compositional distribution in a layered shape is identified by observing a cross section of the crystallographically-oriented ceramic using a scanning electron microscope (SEM). Furthermore, the presence of the first region and the second region containing the specific element in different concentration ranges is identified by observing a cross section of the crystallographically-oriented ceramic using an SEM and by analyzing the element distribution by electron probe microanalysis (EPMA). The thickness of the first region and the thickness of the second region may be the same or different. The thickness of the first region is preferably 10 µm or less, and more preferably 5 µm or less. The same applies to the thickness of the second region. The distance between the first region and the second region is preferably 10 µm or less, and more preferably 5 µm or less. In such a case, since the density of compositional distribution is further increased, piezoelectric/electrostrictive properties are easily enhanced. Note that the distance between the first region and the second region can be obtained as a distance between the point at which the concentration of the specific element is at a maximum and the point at which the concentration of the specific element is at a minimum.

Furthermore, in the compositional distribution, the first region or the second region may be a region in which crystal nuclei remain. In such a case, a compositional distribution can be relatively easily obtained because, in a crystallographically-oriented ceramic, for example, crystal growth is allowed to occur along the crystal plane of crystal nuclei, such as a template member.

Figure 2:
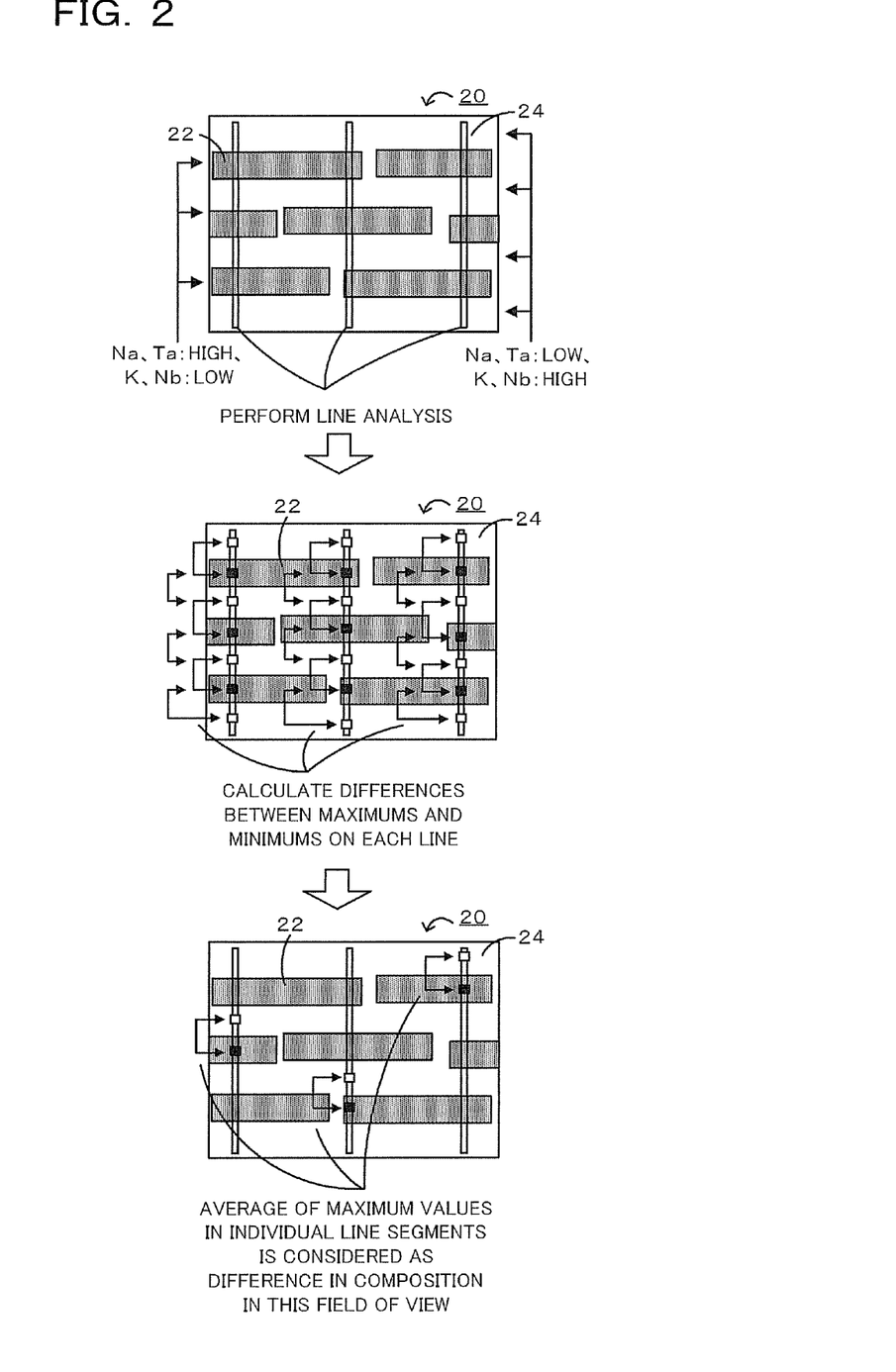
FIG. 2 is a schematic diagram illustrating a method for measuring a difference in composition of crystals contained in a crystallographically-oriented ceramic.

In the crystallographically-oriented ceramic of the present invention, in the compositional distribution, the first region in crystals is composed of an oxide represented by $(A1_{x11} A2_{x12} \ldots An_{x1n})(B1_{y11}B2_{y12} \ldots Bn_{y1n})O_z$, the second region is composed of an oxide represented by $(A1_{x21}A2_{x22} \ldots An_{x2n})(B1_{y21}B2_{y22} \ldots Bn_{y2n})O_z$, wherein n, x1n, x2n, y1n, y2n, and z are positive numbers, and a difference in composition is preferably 0.01 to 0.50, and more preferably 0.1 to 0.30, wherein the difference in composition is the largest value among $|x11\text{-}x21|, |x12\text{-}x22|, \ldots |x1n\text{-}x2n|, |y11\text{-}y21|, |y12\text{-}y22|, \ldots |y1n\text{-}y2n|$. If the difference in composition is 0.01 or more, a distribution also occurs sufficiently with respect to the crystal system and the lattice constant, and thus piezoelectric/electrostrictive properties are easily improved. If the difference in composition is 0.50 or less, crystals can be further stabilized. Here, for example, in the case where crystals include an oxide represented by general formula $ABO_3$ as a main component, the first region is composed of $(Li_{0.04}Na_{0.48}K_{0.48})(Nb_{0.8}Ta_{0.2})O_3$, and the second region is composed of $(Li_{0.01}Na_{0.64}K_{0.35})(Nb_{0.9}Ta_{0.1})O_3$, the difference in composition corresponds to 0.16 with respect to Na, which is the maximum value among differences between coefficients of elements contained in the first region and coefficients of elements contained in the second region. A method for calculating the difference in composition will now be described. FIG. 2 is a schematic diagram illustrating a method for measuring a difference in composition of the crystals contained in a crystallographically-oriented ceramic. First, the crystallographically-oriented ceramic is cut in a direction orthogonal to the oriented crystal plane, and the resulting cross section is observed with an SEM. It is identified whether or not the observed region includes layered portions by SEM observation or by element analysis with EPMA (area analysis) or the like. Next, with respect to a certain element, if there is a portion which includes a layered region having a concentration range recognized as the first region and a layered region having a concentration range recognized as the second region, a field of view where three or more repetitions of the first and second regions having different compositions can be observed is located. In the field view, using EPMA, one or more line analyses are performed in a direction perpendicular to the oriented plane (refer to the top of FIG. 2). Here, three positions, i.e., a center and both ends, are subjected to line analysis. In each line analysis, the compositions at the maximum and the minimum are obtained with respect to the specific element. For example, the composition is obtained as $(A1_{x1}A2_{x2} \ldots An_{xn})(B1_{y1}B2_{y2} \ldots Bn_{yn})O_z$. Next, the absolute values of the difference between the coefficients of elements contained in the first region and coefficients of elements contained in the second region are calculated (refer to the middle of FIG. 2). The maximum value in each line segment is considered as the difference in composition of the line segment. The differences in compositions in the individual line segments are averaged, and the resulting average value is considered as the difference in composition in the field of view (refer to the bottom of FIG. 2). These steps are carried out in one or more fields of view, the average of the differences in composition in the individual fields of view are calculated, and the resulting value is considered as the difference in composition of the crystallographically-oriented ceramic. Here, the differences in composition in three fields of view are averaged to obtain a difference in composition of the crystallographically-oriented ceramic.

In the crystallographically-oriented ceramic of the present invention, the crystals may include, as a main component, an oxide represented by general formula $ABO_3$, wherein the A site contains Pb, and the B site contains at least one element selected from the group consisting of Mg, Zn, Nb, Ni, Ti, and Zr, or wherein the A site contains at least one element selected from the group consisting of Li, Na, K, Bi, and Ag, and the B site contains at least one element selected from the group consisting of Nb, Ta, and Ti. Examples of the former include a $PbMg_{1/3}Nb_{2/3}O_3$—$PbZrO_3$—$PbTiO_3$ ternary solid solution system composition; a composition which includes a $PbMg_{1/3}Nb_{2/3}O_3$—$PbZrO_3$—$PbTiO_3$ ternary solid solution system composition as a main component and contains 0.05% to 3% by weight of NiO; and a $Pb(Mg, Ni)_{1/3}Nb_{2/3}O_3$—$PbZrO_3$—$PbTiO_3$ ternary solid solution system composition. Here, the "main component" in the expression "includes a $PbMg_{1/3}Nb_{2/3}O_3$—$PbZrO_3$—$PbTiO_3$ ternary solid solution system composition as a main component" means that the content of the $PbMg_{1/3}Nb_{2/3}O_3$—$PbZrO_3$—$PbTiO_3$ ternary solid solution system composition is 80% by weight or more, and preferably 90% by weight or more, of the total oxides excluding NiO. Examples of the latter include compositions wherein the A site contains at least one element selected from the group consisting of Li, Na, and K, and the B site contains at least one element selected from the group consisting of Nb and Ta, such as $(Li_XNa_YK_Z)Nb_MTa_NO_3$, $(Bi_XNa_YK_ZAg_N)TiO_3$, and $(Bi_XNa_YK_Z)TiO_3$ (wherein X, Y, Z, M, and N are arbitrary numbers). Furthermore, the crystals may contain an element other than those described above. Examples of the oxide represented by general formula $ABO_3$ have been described above. Other examples that can be used in the present invention include an oxide, such as $Al_2O_3$, $ZrO_2$, $TiO_2$, MgO, CaO, $Y_2O_3$, $SnO_2$, ZnO, or $SiO_2$; a compound oxide, such as $(Ba_XSrY)(Ti_ZZrN)O_3$, $BaTiO_3$, $BiFeO_3$, or $YBa_2Cu_3O_7$; a nitride, such as AlN, $Si_3N_4$, or BN; a boride, such as $CaB_6$, $MgB_2$, or $LaB_6$; a carbide, such as TiC, SiC, or WC; a tellurium compound, such as $Bi_2Te_3$, $Bi_2Sb_8Te_{15}$, or PbTe; a silicide-based material, such as $CrSi_2$, $MnSi_{1.73}$, $FeSi_2$, or $CoSi_2$; and a metal, an alloy, an intermetallic compound, or the like.

A method for producing a crystallographically-oriented ceramic will be described below. The method for producing the crystallographically-oriented ceramic includes step (1) of forming a ceramic sheet which serves as a template (crystal nuclei) for a crystallographically-oriented ceramic, step (2) of shaping in which crystal grains obtained by breaking the ceramic sheet and inorganic particles as raw materials are mixed and subjected to orientation-shaping, and step (3) of firing a shaped body. The individual steps will be described below in that order.

(1) Formation Step of Forming Ceramic Sheet

This step further includes a preparation step of preparing inorganic particles, a sheet shaping step, and a first firing step. In the ceramic sheet, by shaping inorganic particles into a very thin sheet with a thickness of 15 μm or less, followed by firing, crystal grains are grown along the sheet surface. In such a manner, since a sheet-like shaped body with a thickness of 15 μm or less is fired to cause grain growth, grain growth in the thickness direction of the sheet is limited, and grain growth is promoted more in the surface direction of the sheet. Therefore, for example, under predetermined firing conditions, it is possible to allow, in addition to crystal grains that grow into crystal grains with an anisotropic shape, even crystal grains that grow into crystal grains with an isotropic and polyhedral shape, for example, a cube, to grow into planar crystal grains having a larger aspect ratio with specific crystal planes being aligned with the surface of the sheet (being oriented). Therefore, it is possible to obtain crystal grains that are suitable as a template member for a crystallographically-oriented ceramic. Here, the expression "growth form under predetermined firing conditions" is defined as the morphology observed when crystals of inorganic particles come to equilibrium with each other under given heat-treating conditions, which is, for example, obtained by observing the shape of grains at the surface when a bulk is crystallized by firing. Furthermore, the term "anisotropic shape" refers to a shape in which the ratio of major axis length to minor axis length (aspect ratio) is large (e.g., with an aspect ratio of 2 or more), such as a tabular, strip-like, columnar, needle-like, or flake-like shape. Furthermore, the "isotropic and polyhedral" shape means, for example, a cubic shape. The aspect ratio of crystal grains contained in the ceramic sheet is determined by the method described below.

First, an SEM photograph is taken by a scanning electron microscope, and the thickness of the ceramic sheet is determined from the SEM photograph. Next, the sheet surface of the ceramic sheet is observed, and in a field of view which includes about 20 to 40 crystal grains, an area S per grain is calculated using the formula {(area of the field of view)/(number of grains)}. Assuming that each grain has a circular shape, a grain diameter is calculated using formula (2) below. The value obtained by dividing the grain diameter by the thickness of the sheet is defined as the aspect ratio.

$$\text{GRAIN DIAMETER} = 2\sqrt{S/\pi} \qquad \text{Formula (2)}$$

In the preparation step of preparing inorganic particles, preferably, raw materials for the inorganic particles are pulverized and mixed, the mixed powder is calcined, and the resulting inorganic particles are further pulverized. Preferably, the inorganic particles form an oxide having a perovskite structure. Furthermore, preferably, crystals formed after firing are composed of an oxide represented by general formula $ABO_3$, wherein the A site contains at least one element selected from the group consisting of Li, Na, K, Bi, and Ag, and the B site contains at least one element selected from the group consisting of Nb, Ta, and Ti, or wherein the A site contains Pb as a main component, and the B-site contains at least one element selected from the group consisting of Mg, Zn, Nb, Ni, Ti, and Zr. For example, when inorganic particles which form $NaNbO_3$ in which part of the A site is replaced with Li, K, or the like and part of the B site is replaced with Ta or the like, i.e., $(Li_XNa_YK_Z)Nb_MTa_NO_3$ (wherein X, Y, Z, M, and N are arbitrary numbers), are used, the growth form at 900° C. to 1,300° C. is a cubic shape, which is preferable. An element other than those described above may be added. Furthermore, in inorganic particles which form crystals having $(Bi_{0.5}Na_{0.5-x}K_x)TiO_3$ as a main component, when X>0.01, the growth form is a cubic shape, which is preferable. Furthermore, in an oxide represented by general formula $ABO_3$, wherein the A site contains Pb and the B site contains at least two elements selected from the group consisting of Zr, Ti, Nb, Mg, Ni, and Zn, for example, by adjusting the mixing ratio, or by adding an additive (glass or the like) that activates surface diffusion of crystal grains to the oxide, grains may grow into a pseudocubic structure in the shape of a dice (hexahedral shape) among polyhedral shapes, which can be preferably used. When inorganic particles which form an oxide represented by general formula $ABO_3$ are used, preferably, raw materials are prepared such that the ratio of the A site to the B site, A/B, will be 1.0 to 1.3. When the A/B is in the range of 1.0 to 1.3, it is possible to increase the aspect ratio and the degree of orientation of crystals contained in the fired ceramic sheet. Furthermore, preferably, the A/B is in the range of 1.0 to 1.3 in view of compensation of an alkaline component, lead, or the like that volatilizes during firing. As the raw materials for the inorganic particles, oxides, hydroxides, carbonates, sulfates, nitrates, tartrates, or the like of the desired components may be used. Preferably, oxides and carbonates are mainly used. In the pulverization of the inorganic particles, the particle diameter is preferably set according to the thickness of the sheet. The median diameter (D50) of the inorganic particles is preferably 2% to 60% of the thickness of the sheet. If the median diameter is 2% or more of the thickness of the sheet, pulverization can be easily performed. If the median diameter is 60% or less, the thickness of the sheet can be easily adjusted. The particle diameter is determined using a method in which inorganic particles are dispersed in a dispersion medium (organic solvent, water, or the like), and the particle diameter is measured using a laser diffraction/scattering particle size distribution analyzer. The pulverization of the inorganic particles is preferably conducted by wet pulverization. For example, a ball mill, a bead mill, a trommel, an attractors, or the like may be used.

In the ceramic sheet shaping step, the inorganic particles are formed into a self-supported planar shaped body with a sheet thickness of 15 μm or less. The sheet shaping can be conducted, for example, by a doctor-blade method using a slurry containing the inorganic particles, or extrusion molding using a puddle containing the inorganic particles. When the doctor-blade method is used, for example, a slurry is applied to a flexible plate (e.g., organic polymer plate, such as PET film), the applied slurry is solidified by drying to form a shaped body, and the shaped body is separated from the plate. Thereby, a shaped body of the ceramic sheet before firing may be obtained. When a slurry or a puddle is prepared before shaping, the inorganic particles may be dispersed in an appropriate dispersion medium, and a binder, a plasticizer, or the like may be appropriately added thereto. The slurry is preferably adjusted so as to have a viscosity of 500 to 700 cP and is preferably defoamed under reduced pressure. The thickness of the sheet is 15 μm or less, preferably 10 μm or less, more preferably 5 μm or less, and still more preferably 2 μm. At 10 μm or less, a high degree of orientation can be obtained, and at 5 μm or less, a higher degree of orientation can be obtained. The thickness of the sheet is preferably 0.1 μm or more. If the thickness of the sheet is 0.1 μm or more, a self-supported planar sheet can be easily formed. Examples of other methods that may be used include high-speed spraying of particles, such as aerosol deposition; and a method in which a film is formed on a substrate made of a resin, glass, ceramic, metal, or the like by a vapor-phase method, such as sputtering, CVD, or PVD, and then the film is separated from the substrate to obtain a shaped body of the ceramic sheet before firing. In this case, since the density of the shaped body before firing can be increased, grain growth proceeds at low temperature, volatilization of constituent elements can be prevented, and the resulting crystallographically-oriented ceramic has high density, all of which are advantageous.

In the step of firing the ceramic sheet, the shaped body obtained in the shaping step is fired with or without an inactive layer which does not substantially react with the shaped body (e.g., fired ceramic plate, Pt plate, carbon plate, graphite plate, molybdenum plate, or tungsten plate) being disposed adjacent to the shaped body. For example, green sheets and inactive layers may be alternately stacked, followed by firing, the inactive layers being inactive at the firing temperature of the shaped body. Alternatively, a method may be used in which a shaped sheet is stacked on an inactive sheet, the resulting laminate is formed into a roll, and then firing is performed. Alternatively, a method may be used in which a shaped body in the form of a sheet is formed on an inactive layer, and after firing, the sheet is separated from the inactive layer. Alternatively, a method may be used in which a sheet-like shaped body is formed on an inactive layer, and after firing, the inactive layer is removed. Preferably, the shaped body is fired in a state in which volatilization of a specific component (e.g., alkaline component) contained in the shaped body is suppressed. By suppressing a specific element from being volatilized from the shaped body, the composition after firing can be prevented from varying. For example, in order to achieve the volatilization-suppressing state, the shaped body may be fired in a state in which other inorganic particles coexist with the inorganic particles constituting the shaped body, or the shaped body may be placed in a covered sheath or the like and fired in a sealed state. In such a case, it is important to empirically set conditions during firing, such as the amount of the inorganic particles allowed to coexist and the inner volume of the sheath, to be appropriate. Furthermore, from the standpoint of accelerating in-plane grain growth, firing under pressure, such as hot pressing, may be performed. With respect to the firing conditions, preferably, the shaped sheet is fired at a temperature that is higher, by 10 percent or more, than the firing temperature at which equilibrium-shaped crystals are obtained by firing, for example, at the firing temperature at which densification and grain growth are caused by firing a bulk. At the temperature higher by 10 percent or more, grain growth of crystals contained in the ceramic sheet with a thickness of 15 μm or less can be promoted sufficiently. Preferably, firing is performed at a high temperature to such an extent that the material of the shaped body is not decomposed. In particular, when the thickness of the sheet is decreased, grain growth does not easily proceed, and therefore, it is preferable to increase the firing temperature. For example, in the step of firing inorganic particles composed of $NaNbO_3$ to which Li and K are added to the A site and Ta is added to the B site $((Li_XNa_YK_Z)Nb_MTa_NO_3)$, the firing temperature for the shaped body is preferably set at 900° C. to 1,250° C. At a firing temperature of 900° C. or higher, crystal growth of the particles is promoted, which is preferable. At a temperature of 1,250° C. or less, volatilization of the alkali component, etc. can be reduced, and decomposition of the material can be suppressed. By performing firing in such a manner, the inorganic particles contained in the ceramic sheet grow into crystal grains in which the length in the surface direction of the sheet is larger than the length in the thickness direction, and the degree of orientation is 25% or more.

(2) Shaping Step of Shaping Crystallographically-oriented Ceramic

The resulting ceramic sheet is formed into crystal grain powder by breaking such that the aspect ratio is not less than or equal to 2, and preferably not less than or equal to 3. Subsequently, a mixing step is carried out, in which the crystal grain powder, other raw material powder (e.g., non-oriented inorganic particles), and as necessary, a binder, a plasticizer, or the like are mixed. Then, orientation-shaping (secondary orientation) is performed so that the crystal grains are oriented in a predetermined direction. Thereby, it is possible to form an arbitrary shape, for example, with a thickness exceeding 10 µm. At this time, preferably, the compositional ratio of the crystal grain powder obtained from the ceramic sheet is different from the compositional ratio of the other raw material powder. Thereby, it is possible to easily obtain a crystallographically-oriented ceramic having a compositional distribution. Furthermore, in the powder containing the crystal grains, the crystal grains may be separated from each other or a certain number of crystal grains may be bonded together. The orientation-shaping can be performed by the doctor-blade method, extrusion molding, or the like described above. By performing such shaping, a shaped body in which the raw material powder is present around crystal grains oriented in a predetermined direction can be obtained. The resulting shaped body may be directly subjected to the subsequent firing step. Alternatively, two or more shaped bodies may be stacked and then subjected to the subsequent firing step.

(3) Firing Step of Firing Crystallographically-oriented Ceramic

Then, a second firing step is carried out in which the secondary shaped body is fired such that the other raw material powder is oriented in the direction in which the crystal grain powder is oriented. Thereby, a crystallographically-oriented ceramic is obtained. The firing temperature in the second firing step may be the same as or higher by 10% or more than the firing temperature at which equilibrium-shaped crystals are obtained under the predetermined firing conditions described above. However, preferably, the second firing step is carried out at a temperature as low as possible, for example, at a temperature about several percent lower than the firing temperature at which equilibrium-shaped crystals are obtained. In such a case, since portions corresponding to the crystal grains easily remain in the crystallographically-oriented ceramic, the compositional distribution easily occurs in the crystallographically-oriented ceramic. Furthermore, in the case of a shaped body containing a binder or the like, heat treatment, mainly for the purpose of degreasing, may be performed before firing is performed. In such a case, the degreasing temperature is set at a temperature sufficient to thermally decompose organic substances, such as a binder (e.g., 400° C. to 600° C.). After degreasing, preferably, cold isostatic pressing (CIP) is performed before firing is performed. If cold isostatic pressing is further performed on the degreased shaped body, it is possible to suppress a decrease in the degree of orientation resulting from degreasing or a decrease in the density of the sintered body resulting from the volumetric expansion of the shaped body. In this firing step, as in the firing of the ceramic sheet described above, firing may be performed in a volatilization-suppressing state. Thereby, the degree of orientation of the crystallographically-oriented ceramic can be set, for example, at 60% or more.

An example of the resulting crystallographically-oriented ceramic 20 will now be described. As shown in FIG. 1, the crystallographically-oriented ceramic 20 includes first regions 22, which correspond to remaining layers of crystal grains introduced as crystal nuclei in the forming step, and second regions 24, which correspond to non-oriented raw material powder introduced in the forming step. The composition of the crystallographically-oriented ceramic is $(Li_X Na_Y K_Z)Nb_M TaNO_3$. With respect to the crystal grains originating from the ceramic sheet, mixing has been performed such that the Na concentration is higher, the K concentration is lower, the Nb concentration is lower, and the Ta concentration is higher than the raw material not oriented, while with respect to the raw material powder, mixing has been performed such that the Na concentration is lower, the K concentration is higher, the Nb concentration is higher, and the Ta concentration is lower than the crystal grains.

In the crystallographically-oriented ceramic 20 according to this embodiment, first regions, in which crystal nuclei remain and which contain a specific element in a predetermined concentration range and exist at least partially in a layered shape along the crystal plane, and second regions, which contain the specific element in a concentration range different from that of the first regions and exist at least partially in a layered shape along the crystal plane, are alternately repeated, and thereby, the compositional distribution exists in a direction orthogonal to the crystal plane. Since the compositional distribution includes the first regions, in which the Na concentration is higher, the K concentration is lower, the Nb concentration is lower, and the Ta concentration is higher than the second regions, and the second regions, in which the Na concentration is lower, the K concentration is higher, the Nb concentration is higher, and the Ta concentration is lower than the first regions, alternately repeated, higher piezoelectric/electrostrictive properties are exhibited.

It is to be understood that the present invention is not limited to the embodiment described above, and various embodiments within the scope of the technical field of the present invention can be carried out.

For example, in the embodiment described above, the crystallographically-oriented ceramic is produced using the ceramic sheet. However, the present invention is not particularly limited thereto. A crystallographically-oriented ceramic may be produced using crystal grains which have been subjected to crystal growth by a method other than that using the ceramic sheet. For example, instead of the formation step of forming the ceramic sheet described above, a method may be used in which, after tabular crystals having a composition with a layered perovskite structure, which are easily formed into an anisotropic shape (e.g., tabular shape), are obtained, a part of the composition is replaced in a molten salt or the like to form crystal grains having a desired composition, and using the resulting crystal grains, a crystallographically-oriented ceramic is produced. In such a case, it is also possible to obtain the crystallographically-oriented ceramic having higher piezoelectric/electrostrictive properties.

In the embodiment described above, the ceramic sheet is broken, and the broken crystal grains are used to produce a crystallographically-oriented ceramic. The present invention is not limited to the embodiment. For example, a crystallographically-oriented ceramic may be produced by a method including a stacking step of stacking the ceramic sheet and a raw material powder sheet containing raw material powder by screen-printing or the like to form a laminate, and a second firing step of firing the laminate such that the raw material powder is oriented in the direction in which the crystal grains contained in the ceramic sheet are oriented.

EXAMPLES

Examples in which crystallographically-oriented ceramics are specifically produced will be described below.

Experimental Example 1

Formation Step of Forming Ceramic Sheet

Powders ($Li_2CO_3$, $Na_2CO_3$, $K_2CO_3$, $Nb_2O_5$, and $Ta_2O_5$) were weighed such that the composition after firing was $(Li_{0.06}Na_{0.51}K_{0.43})_{1.02}Nb_{0.90}Ta_{0.10}O_3$. The weighed powders, zirconia balls, and ethanol as a dispersion medium were put in a plastic pot, and wet mixing and pulverization were performed by ball milling for 16 hours. The resulting slurry was dried, and then calcination was performed at 850° C. for 5 hours. The calcined powder was subjected to wet pulverization for 40 hours to obtain a powder. The resulting powder, a dispersion medium obtained by mixing equal amounts of xylene and butanol, polyvinyl butyral (BM-2, manufactured by Sekisui Chemical Co., Ltd.) as a binder, a plasticizer (DOP, manufactured by Kurogane Kasei Co., Ltd.), and a dispersant (SP-030, manufactured by Kao Corporation) were mixed to prepare a shaping material in the form of a slurry. The amounts of the individual materials used were 100 parts by weight of the dispersion medium, 10 parts by weight of the binder, 4 parts by weight of the plasticizer, and 2 parts by weight of the dispersant on the basis of 100 parts by weight of the inorganic particles. The resulting slurry was formed into a sheet on a PET film by a doctor-blade method so that the thickness after drying was 5 μm. The resulting shaped body was subjected to degreasing at 600° C. for 2 hours, and then firing was performed at 1,100° C. for 5 hours with the same shaping material being allowed to coexist. After firing, a portion not adhering to the substrate for firing was retrieved, and thereby, a ceramic sheet used for a crystallographically-oriented ceramic was obtained.

Shaping Step of Shaping Crystallographically-oriented Ceramic

The resulting ceramic sheet was broken such that the aspect ratio was not less than or equal to 3, thereby forming powder of crystal grains serving as a template and having the composition $(Li_{0.06}Na_{0.51}K_{0.43})_{1.02}Nb_{0.90}Ta_{0.10}O_3$. Then, into a dispersion medium obtained by mixing equal amounts of xylene and butanol, a powder of inorganic particles (non-oriented raw material powder) as a matrix, the crystal grains, polyvinyl butyral (BM-2, manufactured by Sekisui Chemical Co., Ltd.) as a binder, a plasticizer (DOP, manufactured by Kurogane Kasei Co., Ltd.), and a dispersant (SP-O30, manufactured by Kao Corporation) were mixed to prepare a shaping material in the form of a slurry such that the fired crystallographically-oriented ceramic had the composition $(Li_{0.06}Na_{0.51}K_{0.43})_{1.02}Nb_{0.90}Ta_{0.10}O_3$. With respect to the powder materials, the mixing was performed so that the content of the inorganic particles (matrix) was 80 mole percent and the content of the crystal grains (template) was 20 mole percent. The amounts of the individual materials used were 50 parts by weight of the dispersion medium, 5 parts by weight of the binder, 2 parts by weight of the plasticizer, and 1 part by weight of the dispersant on the basis of 100 parts by weight of the mixed powder materials. The resulting slurry was defoamed by stirring under reduced pressure so that the viscosity was adjusted to 500 to 700 cP. The viscosity of the slurry was measured using an LVT viscometer manufactured by Brookfield. The resulting slurry was formed into a plate-like shape by a doctor-blade method such that crystal grains were oriented in one direction and the thickness after drying was 100 μm, followed by drying at room temperature. Furthermore, 200 plates thus obtained were stacked and pressure-bonded at 20 kg/cm² and 80° C. Thereby, a crystallographically-oriented ceramic shaped body was obtained.

Firing Step of Firing Crystallographically-Oriented Ceramic

The resulting crystallographically-oriented ceramic shaped body was subjected to degreasing at 600° C. for 2 hours, and then firing was performed at 1,000° C. for 5 hours to cause the grain growth of the inorganic particles contained therein along the crystal grains. Thereby, a crystallographically-oriented ceramic of Experimental Example 1 was obtained.

Experimental Examples 2 to 6

A crystallographically-oriented ceramic of Experimental Example 2 was produced as in Experimental Example 1 except that the individual steps were carried out so that the composition of crystal grains as a template was $(Li_{0.05}Na_{0.530}K_{0.420})_{1.02}Nb_{0.880}Ta_{0.120}O_3$, the composition of inorganic particles as a matrix was $(Li_{0.063}Na_{0.505}K_{0.433})_{1.02}Nb_{0.905}Ta_{0.095}O_3$, and the composition of the crystallographically-oriented ceramic was $(Li_{0.06}Na_{0.51}K_{0.43})_{1.02}Nb_{0.90}Ta_{0.10}O_3$. A crystallographically-oriented ceramic of Experimental Example 3 was produced as in Experimental Example 1 except that the individual steps were carried out so that the composition of crystal grains was $(Li_{0.030}Na_{0.680}K_{0.290})_{1.02}Nb_{0.820}Ta_{0.180}O_3$, the composition of inorganic particles was $(Li_{0.068}Na_{0.468}K_{0.465})_{1.02}Nb_{0.920}Ta_{0.080}O_3$, and the composition of the crystallographically-oriented ceramic was $(Li_{0.06}Na_{0.51}K_{0.43})_{1.02}Nb_{0.90}Ta_{0.10}O_3$. A crystallographically-oriented ceramic of Experimental Example 4 was produced as in Experimental Example 1 except that the individual steps were carried out so that the composition of crystal grains was $(Li_{0.020}Na_{0.780}K_{0.200})_{1.02}Nb_{0.750}Ta_{0.250}O_3$, the composition of inorganic particles was $(Li_{0.070}Na_{0.443}K_{0.488})_{1.02}Nb_{0.938}Ta_{0.063}O_3$, and the composition of the crystallographically-oriented ceramic was $(Li_{0.06}Na_{0.51}K_{0.43})_{1.02}Nb_{0.90}Ta_{0.10}O_3$. A crystallographically-oriented ceramic of Experimental Example 5 was produced as in Experimental Example 1 except that the individual steps were carried out so that the composition of crystal grains was $(Li_{0.010}Na_{0.090}K_{0.090})_{1.02}Nb_{0.650}Ta_{0.350}O_3$, the composition of inorganic particles was $(Li_{0.073}Na_{0.413}K_{0.515})_{1.02}Nb_{0.963}Ta_{0.038}O_3$, and the composition of the crystallographically-oriented ceramic was $(Li_{0.06}Na_{0.51}K_{0.43})_{1.02}Nb_{0.90}Ta_{0.10}O_3$. Furthermore, a crystallographically-oriented ceramic of Experimental Example 6 was produced as in Experimental Example 1 except that the individual steps were carried out so that the composition of crystal grains was $(Li_{0.000}Na_{1.000}K_{0.000})_{1.02}Nb_{0.500}Ta_{0.500}O_3$, the composition of inorganic particles was $(Li_{0.075}Na_{0.388}K_{0.538})_{1.02}Nb_{1.000}Ta_{0.000}O_3$, and the composition of the crystallographically-oriented ceramic was $(Li_{0.06}Na_{0.51}K_{0.43})_{1.02}Nb_{0.90}Ta_{0.10}O_3$.

Experimental Example 7

Formation Step of Forming Ceramic Sheet

A $ZnO$—$B_2O_3$—$SiO_2$-based glass powder (ASF1891 manufactured by Asahi Glass (AGG)) (1% by weight) was added to a synthesized powder having the composition after firing $0.2Pb(Mg_{0.33}Nb_{0.67})O_3$-$0.35PbTiO_3$-$0.45PbZrO_3$ to which 1.5% by weight of NiO was added. The weighed mixture, zirconia balls, and ion-exchanged water as a dispersion medium were placed in a plastic pot, and wet mixing was performed using a ball mill for 16 hours. The resulting slurry was dried, and then calcination was performed at 1,000° C. for 2 hours. The calcined powder was subjected to wet pulverization for 12 hours to obtain a powder. The resulting powder, ion-exchanged water as a dispersion medium, polyvinyl butyral (BM-2, manufactured by Sekisui Chemical Co., Ltd.) as a binder, a plasticizer (DOP, manufactured by Kurogane Kasei Co., Ltd.), and a dispersant (SP-O30, manufactured by Kao Corporation) were mixed to prepare a shaping material in the form of a slurry. The amounts of the individual materials used were 50 parts by weight of the dispersion medium, 5 parts by weight of the binder, 2 parts by weight of the plasticizer, and 1 part by weight of the dispersant on the basis of 100 parts by weight of the calcined pulverized powder. The resulting slurry was formed into a sheet on a PET film by a doctor-blade method so that the thickness after drying was 5 μm. The resulting shaped body was subjected to degreasing at 600° C. for 2 hours, and then firing was performed at 1,200° C. for 5 hours, with the same shaping material being allowed to coexist. After firing, a portion not adhering to the substrate for firing was retrieved, and thereby, a ceramic sheet used for a crystallographically-oriented ceramic was obtained.

Shaping Step of Shaping Crystallographically-oriented Ceramic

The resulting ceramic sheet was broken such that the aspect ratio was not less than or equal to 3, thereby forming powder of crystal grains serving as a template. Then, into ion-exchanged water as a dispersion medium, a powder of inorganic particles (non-oriented raw material powder) as a matrix, the crystal grains, polyvinyl butyral (BM-2, manufactured by Sekisui Chemical Co., Ltd.) as a binder, a plasticizer (DOP, manufactured by Kurogane Kasei Co., Ltd.), and a dispersant (SP-O30, manufactured by Kao Corporation) were mixed to prepare a shaping material in the form of a slurry such that the fired crystallographically-oriented ceramic had the composition $0.20Pb(Mg_{0.33}Nb_{0.67})O_3$-$0.35PbTiO_3$-$0.45PbZrO_3$ to which 1.5% by weight of NiO was added. With respect to the powder materials, the mixing was performed so that the content of the inorganic particles (matrix) was 80 mole percent and the content of the crystal grains (template) was 20 mole percent. The amounts of the individual materials used were 50 parts by weight of the dispersion medium, 5 parts by weight of the binder, 2 parts by weight of the plasticizer, and 1 part by weight of the dispersant on the basis of 100 parts by weight of the mixed powder materials. The resulting slurry was defoamed by stirring under reduced pressure so that the viscosity was adjusted to 500 to 700 cP. The viscosity of the slurry was measured using an LVT viscometer manufactured by Brookfield. The resulting slurry was formed into a plate-like shape by a doctor-blade method such that crystal grains were oriented in one direction and the thickness after drying was 100 μm, followed by drying at room temperature. Furthermore, 200 plates thus obtained were stacked and pressure-bonded at 20 kg/cm² and 80° C. Thereby, a crystallographically-oriented ceramic shaped body was obtained.

(Firing Step of Firing Crystallographically-oriented Ceramic)

The resulting crystallographically-oriented ceramic shaped body was subjected to degreasing at 600° C. for 2 hours, and then firing was performed at 1,200° C. for 3 hours to cause the grain growth of the inorganic particles contained therein along the crystal grains. Thereby, a crystallographically-oriented ceramic of Experimental Example 7 was obtained.

Experimental Examples 8 to 10

A crystallographically-oriented ceramic of Experimental Example 8 was produced as in Experimental Example 7 except that the individual steps were carried out so that the composition of crystal grains as a template was $0.17Pb(Mg_{0.33}Nb_{0.67})O_3$-$0.34PbTiO_3$-$0.49PbZrO_3$, the composition of inorganic particles as a matrix was $0.21Pb(Mg_{0.33}Nb_{0.67})O_3$-$0.35PbTiO_3$-$0.44PbZrO_3$, and the composition of the crystallographically-oriented ceramic was $0.20Pb(Mg_{0.33}Nb_{0.67})O_3$-$0.35PbTiO_3$-$0.45PbZrO_3$ to which 1.5% by weight of NiO was added. A crystallographically-oriented ceramic of Experimental Example 9 was produced as in Experimental Example 7 except that the individual steps were carried out so that the composition of crystal grains was $0.12Pb(Mg_{0.33}Nb_{0.67})O_3$-$0.30PbTiO_3$-$0.58PbZrO_3$, the composition of inorganic particles was $0.22Pb(Mg_{0.33}Nb_{0.67})O_3$-$0.36PbTiO_3$-$0.42PbZrO_3$, and the composition of the crystallographically-oriented ceramic was $0.20Pb(Mg_{0.33}Nb_{0.67})O_3$-$0.35PbTiO_3$-$0.45PbZrO_3$ to which 1.5% by weight of NiO was added. Furthermore, a crystallographically-oriented ceramic of Experimental Example 10 was produced as in Experimental Example 7 except that the individual steps were carried out so that the composition of crystal grains was $0.10Pb(Mg_{0.33}Nb_{0.67})O_3$-$0.27PbTiO_3$-$0.63PbZrO_3$, the composition of inorganic particles was $0.22Pb(Mg_{0.33}Nb_{0.67})O_3$-$0.37PbTiO_3$-$0.41PbZrO_3$, and the composition of the crystallographically-oriented ceramic was $0.20Pb(Mg_{0.33}Nb_{0.67})O_3$-$0.35PbTiO_3$-$0.45PbZrO_3$ to which 1.5% by weight of NiO was added.

X-ray Diffraction Measurement and Calculation of Degree of Orientation

With respect to each of Experimental Examples 1 to 10, XRD patterns were measured when the crystal plane of the crystallographically-oriented ceramic was irradiated with X-ray using an XRD device (RAD-IB manufactured by Rigaku Corporation). The degree of orientation of the pseudocubic (100) plane was measured by the Lotgering method in which the degree of orientation was calculated according to the formula (1) described above using peaks of pseudocubic (100), (110), and (111) planes.

(SEM Observation and Compositional Distribution Measurement)

With respect to a cross section perpendicular to the oriented crystal plane in each of Experimental Examples 1 to 10, SEM photographs were taken using a scanning electron microscope (JSM-6390 manufactured by JEOL Ltd.). At this time, the compositional distribution was measured by EPMA with respect to Na, K, Nb, and Ta in the observed range. Furthermore, line analyses were performed using EPMA, and a difference in composition was obtained for each experimental example. The difference in composition was obtained by the method described below. First, in the range observed by the SEM, with respect to a certain element, a portion which includes a layered region having a concentration range recognized as the first region and a layered region having a concentration range recognized as the second region was identified by element analysis with EPMA (area analysis). Then, the magnification of the SEM and the position of observation were set so as to have a field of view where three or more repetitions of the first and second regions having different compositions could be observed. In the field view, using EPMA, one or more line analyses were performed in a direction perpendicular to the oriented plane, at a center and both ends (refer to the top of FIG. 2). Next, in each line analysis, the compositions at the maximum and the minimum were obtained with respect to the specific element. For example, the composition was obtained as $(A1_{x1}A2_{x2} \ldots An_{xn})(B1_{y1}B2_{y2} \ldots Bn_{ym})O_z$. Next, the absolute values of the difference between the coefficients of elements contained in the first region and coefficients of elements contained in the second region were calculated (refer to the middle of FIG. 2). The maximum value in each line segment was considered as the difference in composition of the line segment. The differences in compositions in the individual line segments were averaged, and the resulting average value was considered as the difference in composition in the field of view (refer to the bottom of FIG. 2). These steps were carried out in three fields of view, the average of the differences in composition in the individual fields of view was calculated, and the resulting value was considered as the difference in composition of the crystallographically-oriented ceramic.

Measurement of Electric-field-induced Strain

With respect to each of Experimental Examples 1 to 10, the crystallographically-oriented ceramic was machined into a size of 12 mm×3 mm×1 mm, and electrodes were formed on both surfaces of the resulting test piece by sputtering gold at a thickness of 0.05 µm. The test piece was immersed in silicone oil at 50° C. and polarized for 15 minutes by applying a direct-current electric field of 4 kV/mm between the electrodes. Strain gauges (KFG type manufactured by KYOWA) were attached to both electrode surfaces after polarization, and amounts of strain in a direction perpendicular to the electric field were measured when an electric field of 4 kV/mm was applied. The average value between both electrode surfaces was defined as the electric-field-induced strain.

Measurement Results

Figure 3:
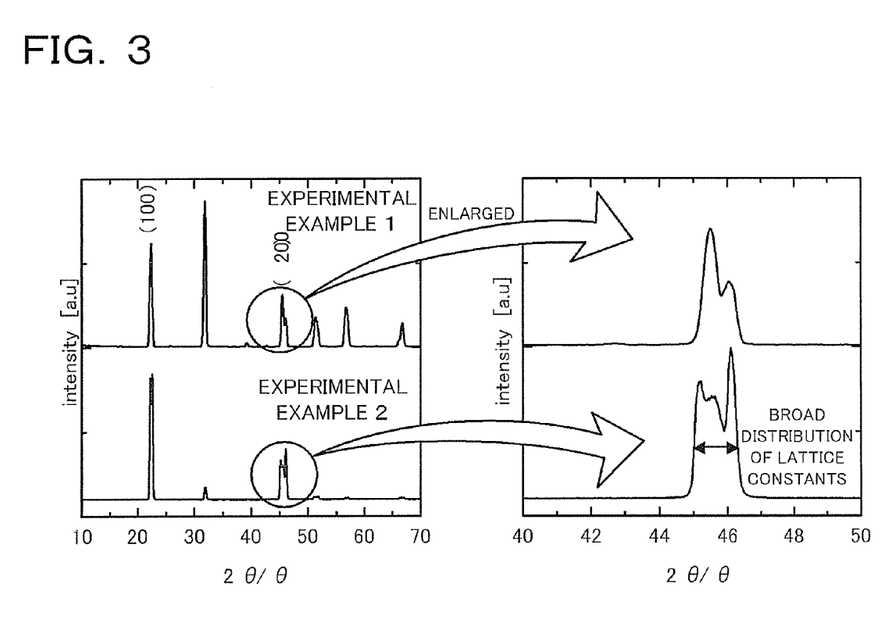
FIG. 3 is a graph showing X-ray diffraction measurement results in Experimental Examples 1 and 2.
Figure 4:
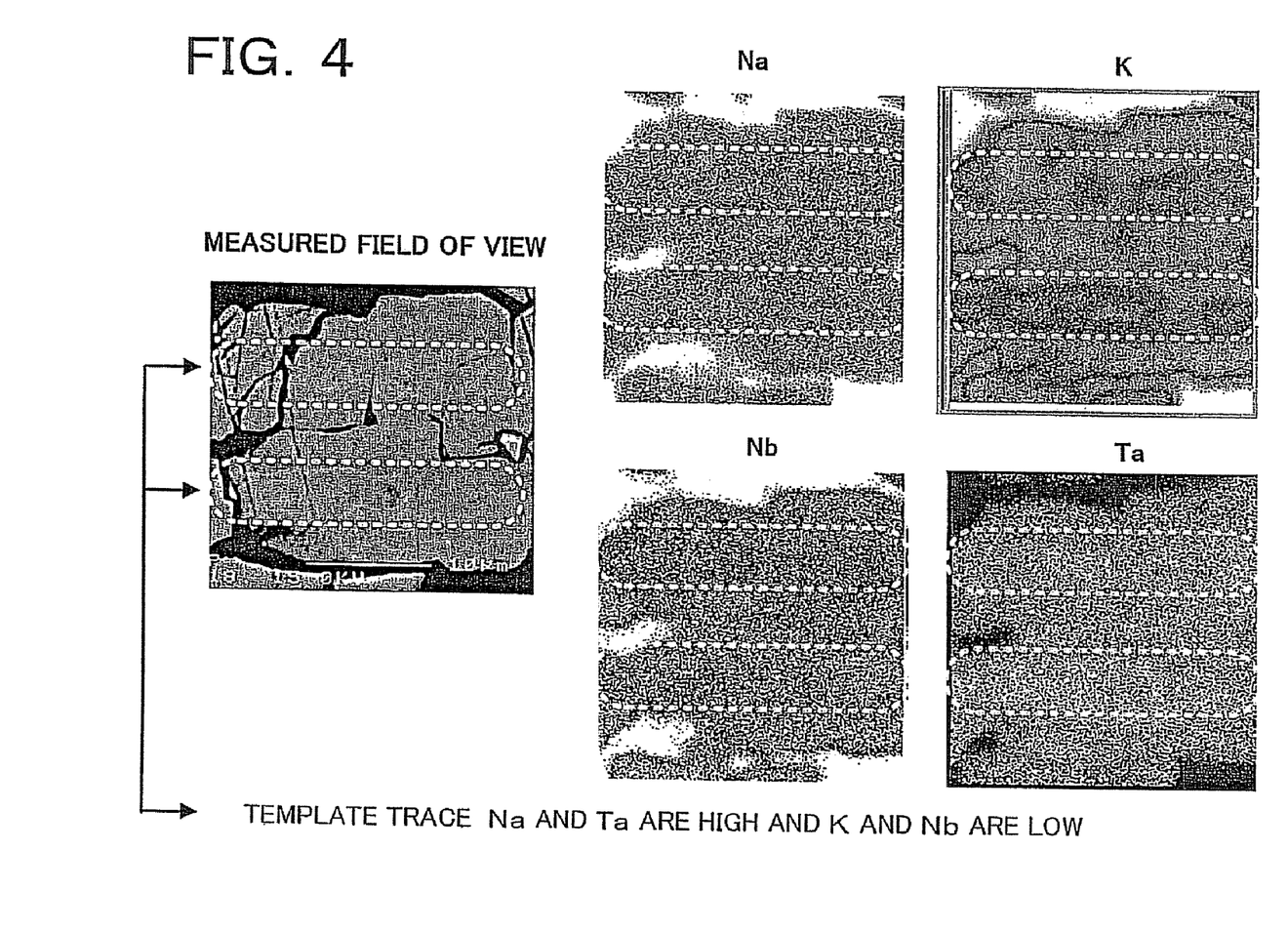
FIG. 4 shows SEM photographs and results of compositional distribution measurement in regions observed in Experimental Example 2.
Figure 5:
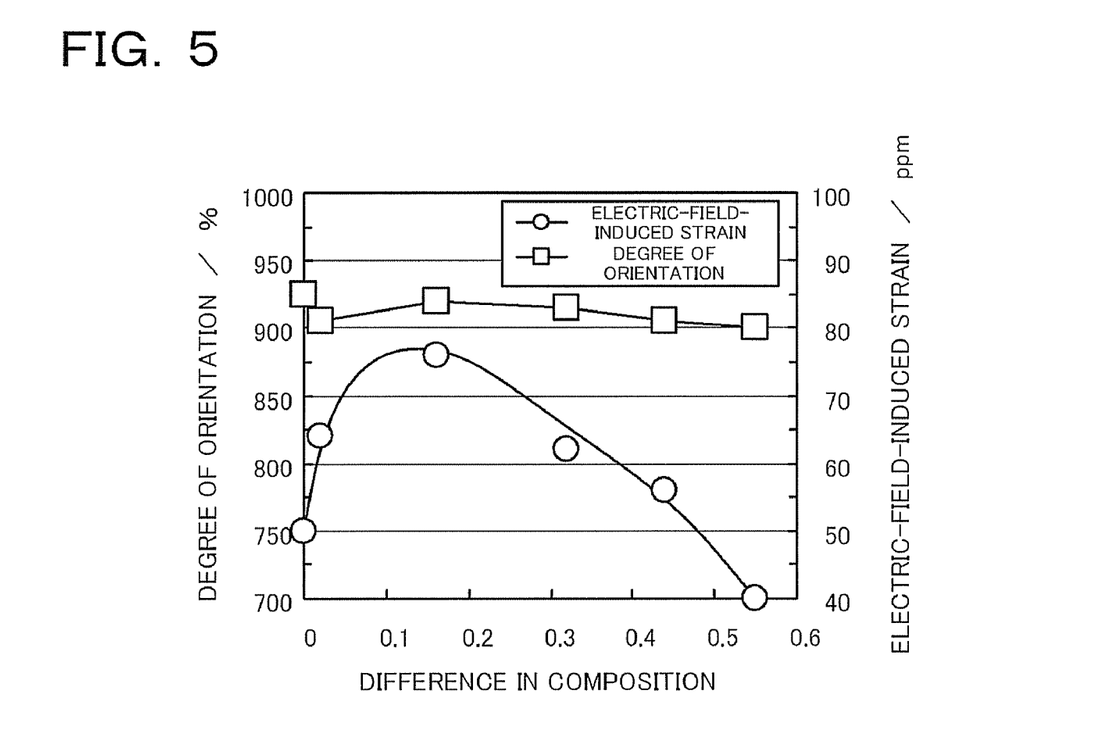
FIG. 5 is a graph showing a relationship between the difference in composition and each of the degree of orientation and the electric-field-induced strain in Experimental Examples 1 to 6.
Figure 6:
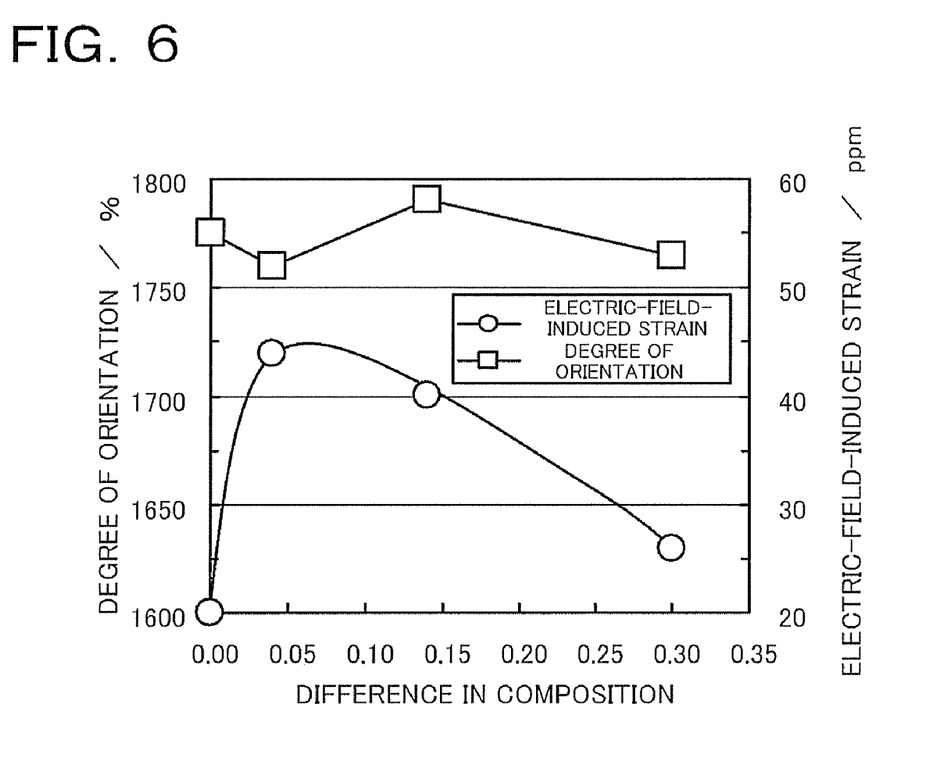
FIG. 6 is a graph showing a relationship between the difference in composition and each of the degree of orientation and the electric-field-induced strain in Experimental Examples 7 to 10.

FIG. 3 is a graph showing X-ray diffraction measurement results for Experimental Examples 1 and 2. FIG. 4 shows SEM photographs and results of compositional distribution measurement in regions observed in Experimental Example 2. FIG. 5 is a graph showing a relationship between the difference in composition and each of the degree of orientation and the electric-field-induced strain in the crystallographically-oriented ceramics of Experimental Examples 1 to 6. FIG. 6 is a graph showing a relationship between the difference in composition and each of the degree of orientation and the electric-field-induced strain in the crystallographically-oriented ceramics of Experimental Examples 7 to 10. Furthermore, the measurement results are summarized in Table 1. As is evident from Table 1, the difference in composition increases as the difference in the compositions between the template and the matrix becomes larger. Regarding the X-ray diffraction measurement results, as shown in FIG. 3, in Experimental Example 2, peaks corresponding to the (100) plane and (200) plane have the distribution, which suggests the presence of crystals having a plurality of lattice constants, i.e., the occurrence of a compositional distribution. Furthermore, according to the results of compositional distribution measurement in Experimental Example 2, as shown in FIG. 4, in regions where crystal grains remain with a thickness of about 4 µm (refer to regions surrounded by doffed lines), the concentrations of Na and Ta are high, and the concentrations of K and Nb are low. On the other hand, in the region of raw material powder other than the crystal grains, the concentrations of Na and Ta are low, and the concentrations of K and Nb are high. Furthermore, it has also been confirmed that an element distribution also occurs within a crystal grain, namely, regions having different compositions are present within a crystal grain. That is, it has been found that, in the crystallographically-oriented ceramic of Experimental Example 2, first regions existing at least partially in a layered shape along the crystal plane and corresponding to crystal grains having a high Na concentration, a low K concentration, a low Nb concentration, and a high Ta concentration and second regions existing at least partially in a layered shape along the crystal plane and corresponding to a raw material powder having a low Na concentration, a high K concentration, a high Nb concentration, and a low Ta concentration are alternately repeated, and thus the compositional distribution exists in a direction orthogonal to the crystal plane. The distance between the first region and the second region is about 5 µm Furthermore, as shown in FIGS. 5 and 6, even if the degree of orientation is nearly the same, when the difference in composition is in a range of 0.01 to 0.50, the electric-field-induced strain has a higher value. When the difference in composition is in a range of 0.1 to 0.3, more suitable piezoelectric/ electrostrictive properties are exhibited. Furthermore, from the experimental results, it is estimated that use of crystal grains having a relatively large thickness as a template, variance in composition between the crystal grains and the raw material powder, lowering the firing temperature of the crystallographically-oriented ceramic, etc. contribute to improvement of piezoelectric/electrostrictive properties.

TABLE 1

| Sample | Composition Template (crystal grains) | Composition Matrix (inorganic particles) | Difference in[3] Composition | Degree of[4] orientation % | Electric-field-induced strain ppm |
|---|---|---|---|---|---|
| Example 1[1] | $(Li_{0.060}Na_{0.510}K_{0.430})_{1.02}Nb_{0.900}Ta_{0.100}O_3$ | $(Li_{0.060}Na_{0.510}K_{0.430})_{1.02}Nb_{0.900}Ta_{0.100}O_3$ | 0.00 | 85 | 750 |
| Example 2[1] | $(Li_{0.050}Na_{0.530}K_{0.420})_{1.02}Nb_{0.880}Ta_{0.120}O_3$ | $(Li_{0.063}Na_{0.505}K_{0.433})_{1.02}Nb_{0.905}Ta_{0.095}O_3$ | 0.02 | 81 | 820 |
| Example 3[1] | $(Li_{0.030}Na_{0.680}K_{0.290})_{1.02}Nb_{0.820}Ta_{0.180}O_3$ | $(Li_{0.068}Na_{0.468}K_{0.465})_{1.02}Nb_{0.920}Ta_{0.030}O_3$ | 0.16 | 84 | 880 |
| Example 4[1] | $(Li_{0.020}Na_{0.780}K_{0.200})_{1.02}Nb_{0.750}Ta_{0.250}O_3$ | $(Li_{0.070}Na_{0.443}K_{0.488})_{1.02}Nb_{0.938}Ta_{0.063}O_3$ | 0.32 | 83 | 810 |
| Example 5[1] | $(Li_{0.010}Na_{0.900}K_{0.090})_{1.02}Nb_{0.650}Ta_{0.350}O_3$ | $(Li_{0.073}Na_{0.413}K_{0.515})_{1.02}Nb_{0.963}Ta_{0.038}O_3$ | 0.44 | 81 | 780 |
| Example 6[1] | $(Li_{0.000}Na_{1.000}K_{0.000})_{1.02}Nb_{0.500}Ta_{0.500}O_3$ | $(Li_{0.075}Na_{0.388}K_{0.538})_{1.02}Nb_{1.000}Ta_{0.000}O_3$ | 0.55 | 80 | 700 |
| Example 7[2] | $0.20Pb(Mg_{0.33}Nb_{0.67})O_3$—$0.35PbTiO_3$—$0.45PbZrO_3$ | $0.20Pb(Mg_{0.33}Nb_{0.67})O_3$—$0.35PbTiO_3$—$0.45PbZrO_3$ | 0.00 | 55 | 1600 |
| Example 8[2] | $0.17Pb(Mg_{0.33}Nb_{0.67})O_3$—$0.34PbTiO_3$—$0.49PbZrO_3$ | $0.21Pb(Mg_{0.33}Nb_{0.67})O_3$—$0.35PbTiO_3$—$0.44PbZrO_3$ | 0.04 | 52 | 1720 |
| Example 9[2] | $0.12Pb(Mg_{0.33}Nb_{0.67})O_3$—$0.30PbTiO_3$—$0.58PbZrO_3$ | $0.22Pb(Mg_{0.33}Nb_{0.67})O_3$—$0.36PbTiO_3$—$0.42PbZrO_3$ | 0.14 | 58 | 1700 |
| Example 10[2] | $0.10Pb(Mg_{0.33}Nb_{0.67})O_3$—$0.27PbTiO_3$—$0.63PbZrO_3$ | $0.22Pb(Mg_{0.33}Nb_{0.67})O_3$—$0.37PbTiO_3$—$0.41PbZrO_3$ | 0.30 | 53 | 1630 |

[1] 20 mole percent of crystal grains was added to achieve the composition $(Li_{0.06}Na_{0.51}K_{0.43})_{1.02}Nb_{0.90}Ta_{0.10}O_3$
[2] 20 mole percent of crystal grains was added to achieve the composition $0.20Pb(Mg_{0.33}Nb_{0.67})O_3$—$0.35PbTiO_3$—$0.45PbZrO_3$
[3] Measured by EPMA
[4] Degree of orientation of the (100) plane measured by the Lotgering method The present application claims the benefit of the priority from Japanese Patent Application No. 2008-10167 filed on Jan. 21, 2008, the entire contents of which are incorporated herein by reference.

What is claimed is:

1. A crystallographically-oriented ceramic comprising crystals oriented along a predetermined crystal plane;
   wherein an element compositional distribution exists in a direction orthogonal to the crystal plane;
   wherein the element compositional distribution has regions having different compositions within a crystal grain; and
   wherein the crystallographically-oriented ceramic has a degree of orientation of 25% or more when measured by the Lotgering method.

2. The crystallographically-oriented ceramic according to claim 1, wherein the element compositional distribution exists at least partially in a layered shape along the crystal plane.

3. The crystallographically-oriented ceramic according to claim 1, wherein, in the element compositional distribution, first regions containing a specific element in a predetermined concentration range and second regions containing the specific element in a different concentration range from the first regions are alternately repeated.

4. The crystallographically-oriented ceramic according to claim 3, wherein, in the element compositional distribution, the first regions in crystals are composed of an oxide represented by $(A1_{x11}A2_{x12} \ldots An_{x1n})(B1_{y11}B2_{y12} \ldots Bn_{y1n})O_z$, the second regions are composed of an oxide represented by $(A1_{x21}A2_{x22} \ldots An_{x2n})(B1_{y21}B2_{y22} \ldots Bn_{y2n})O_z$, wherein n, x1n, x2n, y1n, y2n, and z are positive numbers, and a difference in composition is 0.01 to 0.50, wherein the difference in composition is the largest value among $|x11-x21|$, $|x12-x22|, \ldots |x1n-x2n|$, $|y11-y21|$, $|y12-y22|, \ldots |y1n-y2n|$.

5. The crystallographically-oriented ceramic according to claim 4, wherein the difference in composition is 0.1 to 0.30.

6. The crystallographically-oriented ceramic according to claim 3, wherein the first regions or the second regions are regions in which crystal nuclei remain.

7. The crystallographically-oriented ceramic according to claim 1, wherein the crystals include an oxide represented by a general formula $ABO_3$, wherein an A site contains Pb, and a B site contains at least one element selected from the group consisting of Mg, Zn, Nb, Ni, Ti, and Zr.

8. The crystallographically-oriented ceramic according to claim 1, wherein the crystals include an oxide represented by a general formula $ABO_3$, wherein an A site contains at least one element selected from the group consisting of Li, Na, and K, and a B site contains at least one element selected from the group consisting of Nb and Ta.

9. The crystallographically-oriented ceramic according to claim 3, wherein in each of the first regions, a concentration of Na is higher, a concentration of K is lower, a concentration of Nb is lower, and a concentration of Ta is higher than that of each of the second regions.

* * * * *